(12) United States Patent
Yeates

(10) Patent No.: US 8,738,104 B2
(45) Date of Patent: May 27, 2014

(54) METHODS AND SYSTEMS FOR INTEGRALLY TRAPPING A GLASS INSERT IN A METAL BEZEL

(75) Inventor: Kyle H. Yeates, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 466 days.

(21) Appl. No.: 12/172,073

(22) Filed: Jul. 11, 2008

(65) Prior Publication Data

US 2009/0017263 A1     Jan. 15, 2009

Related U.S. Application Data

(60) Provisional application No. 60/949,449, filed on Jul. 12, 2007, provisional application No. 61/013,600, filed on Dec. 13, 2007.

(51) Int. Cl.
*H04M 1/00* (2006.01)
(52) U.S. Cl.
USPC .... 455/575.8; 455/566; 455/90.3; 455/550.1; 361/679.3
(58) Field of Classification Search
USPC ............. 455/575.8, 90.3, 90.1, 575.1, 347, 455/550.1, 566; 361/679.3, 679.55, 679.56
See application file for complete search history.

(56) References Cited

U.S. PATENT DOCUMENTS

| | | | | |
|---|---|---|---|---|
| 5,722,055 | A * | 2/1998 | Kobayashi et al. | 455/575.8 |
| 6,771,490 | B2 * | 8/2004 | Peker et al. | 361/679.34 |
| 6,996,425 | B2 * | 2/2006 | Watanabe | 455/575.1 |
| 7,224,945 | B2 * | 5/2007 | Gartrell | 455/90.3 |
| 7,228,157 | B2 * | 6/2007 | Lee | 455/566 |
| 7,330,743 | B2 * | 2/2008 | Hutchison et al. | 455/575.8 |
| 7,684,178 | B2 * | 3/2010 | Hsu et al. | 361/679.21 |
| 7,974,660 | B2 * | 7/2011 | Hsu et al. | 455/566 |
| 8,060,168 | B2 * | 11/2011 | Horrdin et al. | 455/575.8 |
| 8,086,285 | B2 * | 12/2011 | McNamara et al. | 455/575.1 |
| 8,086,291 | B2 * | 12/2011 | Maenpaa et al. | 455/575.8 |
| 8,346,183 | B2 * | 1/2013 | Prest et al. | 455/90.3 |
| 2008/0227507 | A1 * | 9/2008 | Joo | 455/575.8 |
| 2010/0014232 | A1 * | 1/2010 | Nishimura | 361/679.3 |

FOREIGN PATENT DOCUMENTS

| | | |
|---|---|---|
| CN | 1526030 A | 9/2004 |
| DE | 100 53 199 | 5/2001 |
| DE | 10053199 A1 | 5/2001 |
| GB | 1316403 | 5/1973 |
| JP | 02 129307 | 5/1990 |
| JP | 2129307 A | 5/1990 |

(Continued)

OTHER PUBLICATIONS

International Search Report and Written Opinion for PCT/US/2008/069869, mailed Nov. 21, 2008.

(Continued)

*Primary Examiner* — Sharad Rampuria
(74) *Attorney, Agent, or Firm* — Pillsbury Winthrop Shaw Pittman LLP

(57) ABSTRACT

Methods and apparatus for creating an overall assembly formed from a transparent member and a metal member are disclosed. According to one aspect of the present invention, a method includes positioning a transparent member in a mold configured for insertion molding, and providing a liquid metal into the mold. The method also includes hardening the liquid metal in the mold. Hardening the liquid metal includes binding the metal to the transparent member to create the integral assembly.

23 Claims, 13 Drawing Sheets

(56) References Cited

FOREIGN PATENT DOCUMENTS

| | | |
|---|---|---|
| JP | H06-179069 | 6/1994 |
| JP | H06-212205 | 8/1994 |
| JP | 2001-030048 A | 2/2001 |
| JP | 2002-011826 A | 1/2002 |
| JP | 2002-263821 | 9/2002 |
| JP | 2004-190781 A | 7/2004 |
| JP | 2004-537417 A | 12/2004 |
| JP | 2005-509090 A | 4/2005 |
| JP | 2005209868 | 8/2005 |
| JP | 2006-021400 A | 8/2006 |
| KR | 2007045768 | 5/2007 |
| WO | 03009088 A | 1/2003 |
| WO | WO 03/009088 | 1/2003 |
| WO | 03012157 A | 2/2003 |
| WO | WO 03/012157 | 2/2003 |
| WO | WO 2008/010917 | 1/2008 |

OTHER PUBLICATIONS

Office Action in related European application No. 08772529.7 mailed Mar. 17, 2011.
International Preliminary Examination Report for PCT/US/2008/069869, mailed Jan. 21, 2010.
Office Action in related Taiwanese application No. 097126674 mailed Oct. 26, 2011 with English Translation.
Office Actin in related Japanese application No. 2010-516285 mailed Jan. 4, 2012 with English Translation.
Office Action in related Chinese Application No. 200880105518.4 mailed Aug. 29, 2011.
Japanese Office Action, Application No. JP2010-516285, mail date: Nov. 6, 2012, total of 9 pages.
Japanese Office Action, Japanese Patent Application No. 2013-096107, mail date Mar. 4, 2014, total of 9 pages.
Taiwanese Office Action, receipt date Oct. 21, 2013, mail date Oct. 17, 2013, Taiwan Application No. 097126674, total of 11 pages.

* cited by examiner

METHODS AND SYSTEMS FOR INTEGRALLY TRAPPING A GLASS INSERT IN A METAL BEZEL

CROSS-REFERENCE TO RELATED APPLICATIONS

This application claims priority benefit of: (i) U.S. Provisional Patent Application No. 60/949,449, filed Jul. 12, 2007, and entitled "Insert Molding Liquid Metal Around Glass," which is hereby incorporated herein by reference; and (ii) U.S. Provisional Patent Application No. 61/013,600, filed Dec. 13, 2007, and entitled "Methods and Systems for Integrally Trapping a Glass Insert in a Metal Bezel," which is hereby incorporated herein by reference

BACKGROUND OF THE INVENTION

1. Field of the Invention

The present invention relates to methods and systems for creating integral glass and metal parts.

2. Description of the Related Art

During the manufacture of electronic devices such as cellular telephones, digital music players, and handheld computing devices, transparent components are often held within housings or the like. By way of example, many electronic devices have displays that include glass or plastic windows which are held by a metal housing. Typically, a metal frame or housing is formed, and a glass component or a plastic component is inserted into the formed frame or housing.

In order to properly secure a metal frame and a glass component together, the tolerances associated with the fit between the metal frame and the glass component must be strictly maintained. That is, the tolerance matches between the metal frame and the glass component are maintained such that the glass component may be inserted into the metal frame and held in place. An overall assembly that includes a metal frame and a glass component inserted therein may be held together by a press fit, using adhesive materials, and/or using mechanical structures such as screws. If the tolerance matches between the metal frame and the glass component are not strictly maintained, the integrity of the overall assembly may be compromised. For relatively small assemblies, maintaining critical tolerances between metal frames and glass components such that tolerance mismatches are unlikely to occur may be difficult.

Therefore, what is needed is a method and an apparatus which allows for the tolerances associated with a metal frame and a glass component, or a metal frame and a plastic component, to be substantially relaxed.

SUMMARY OF THE INVENTION

The present invention pertains to techniques that enable an assembly that includes a transparent member that is integrally formed with a metal member.

The present invention may be implemented in numerous ways, including, but not limited to, as a method, system, device, or apparatus. Example embodiments of the present invention are discussed below.

According to one aspect of the present invention, a method includes positioning a transparent member in a mold configured for insertion molding, and providing a liquid metal into the mold. The method also includes hardening the liquid metal in the mold. Hardening the liquid metal includes binding the metal to the transparent member to create the integral assembly.

In accordance with another aspect of the present invention, a method for forming an integral assembly includes positioning a transparent member in a mold and using a metal injection molding (MIM) process to provide metal around the transparent member. The method also includes shrinking the metal at least partially around the transparent member to bind the metal to the transparent member to create the integral assembly. In one embodiment, shrinking the metal includes shrinking the metal by between approximately twenty percent and approximately thirty percent.

According to still another aspect of the present invention, a method includes applying at least one layer of a compliant material to an edge of a transparent member. A compliant material is bound to an edge of a metal member arrangement. Binding the compliant material to the edge of the metal member arrangement creates an overall assembly. In one embodiment, the compliant material is a gasket.

In accordance with yet another aspect of the present invention, an apparatus includes a transparent member, a metal member, and a compliant member. The transparent member includes a first channel, and the metal member includes a second channel. The compliant material is arranged in the first channel and the second channel such that the complaint material couples the transparent the transparent member to the metal member.

BRIEF DESCRIPTION OF THE DRAWINGS

The invention will be readily understood by the following detailed description in conjunction with the accompanying drawings, in which.

DETAILED DESCRIPTION OF THE INVENTION

Figure 1:
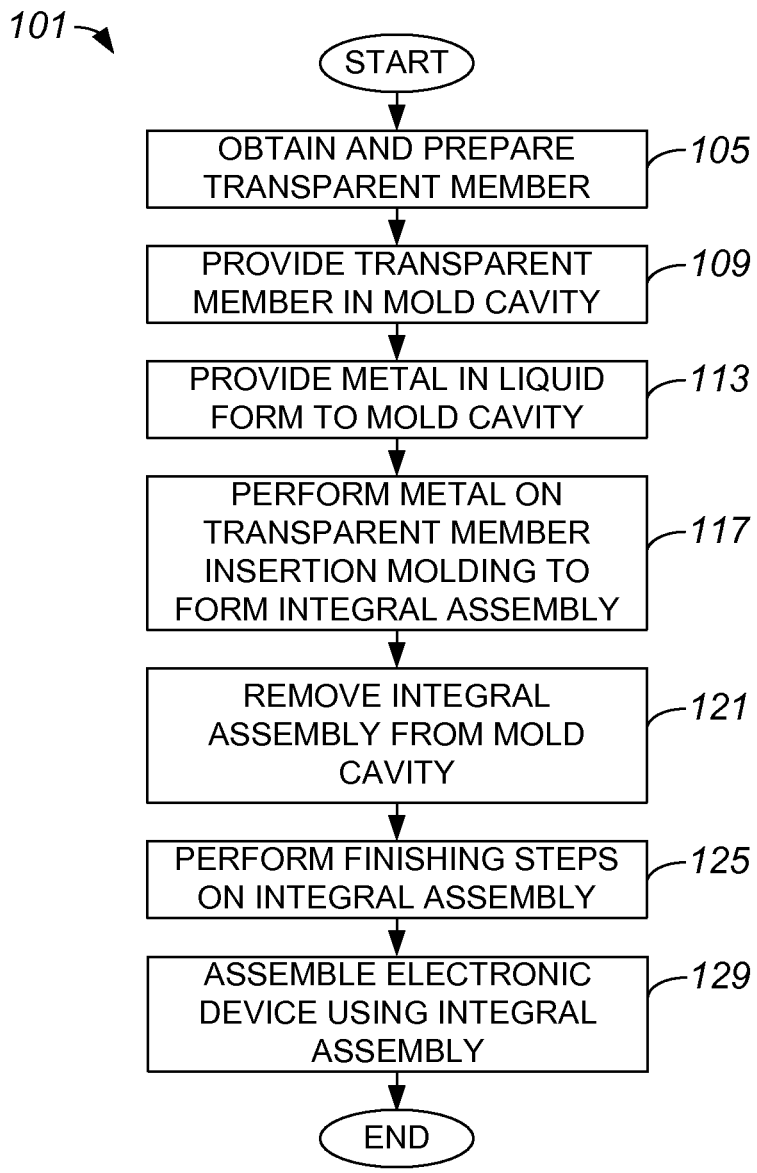
FIG. 1 is a process flow diagram which illustrates a method of creating an integral assembly that includes a metal member and a transparent member, e.g., glass, using an insertion molding process in accordance with an embodiment of the present invention.

Example embodiments of the present invention are discussed below with reference to the various figures. However, those skilled in the art will readily appreciate that the detailed description given herein with respect to these figures is for explanatory purposes, as the invention extends beyond these embodiments.

To facilitate the formation of an overall housing of an electronic device, e.g., a cellular telephone or a digital media player, that includes a window or the like, an integral assembly may be formed to include the window. The integral assembly may be an overall housing in that the overall housing may include a glass member, or a plastic member, and a metal member. Alternatively, the integral assembly may be a part that is arranged to be assembled into an overall assembly, and may include a glass member, or a plastic member, and a metal member. When the integral assembly is a part that is arranged to be assembled into the overall assembly, the metal member may effectively be a bezel that is formed around the edge of a glass member. Although such a bezel may be formed from metal, a bezel may generally be formed from substantially any suitable material including, but not limited to including, a compliant material.

The overall housing is integral in that a glass member and a metal, or a plastic member and a metal, form a single, unified piece. A single, unified piece that includes a glass member and a metal are typically formed such that there are effectively no voids, gaps, or spaces between the glass member and the metal. The glass member and the metal are substantially directly bonded together.

A variety of different methods may be used to form a bezel around a glass member. By way of example, insertion molding methods and metal injection molding (MIM) methods may be used to integrally form a bezel that engages a glass member. Insertion molding refers to an injection molding technique where plastic is injected into a mold in order to surround an insert piece already located in the mold. According to one embodiment, the invention contemplates using the insert molding technique, but rather than injecting plastic around a metal insert, injecting a metal in liquid form around a glass insert. Once hardened, a single part containing a metal member and a glass member is created. The single part may be, in one embodiment, an integral glass and metal assembly or, more generally, an integral assembly. In one example, the metal member may be a portion of a housing of an electronic device and the glass member may be a glass window of an electronic device. The glass window may be a protective shield that covers a display or touch screen, or it may be substantially integral with a display or touch screen.

The metal used in an insertion molding process is typically in liquid form. The metal in liquid form may for example correspond to amorphous alloys, which are metals that may behave like plastic, or alloys with liquid atomic structures. LiquidMetal is one suitable example for the metal in liquid form. Substantially any metal or, more generally, material in liquid form which has a thermal expansion rate that is similar to the thermal expansion rate of liquid metal may be used in an insertion molding process. For example, metals which may be used in an insertion molding process generally include metals that may be injection molded such as steel and aluminum. Other materials from which may be used in an insertion molding process, e.g., to form a bezel around a glass window, may include plastics (e.g., polycarbonate, ABS, etc.) and/or ceramics (e.g., alumina, zirconia, etc.).

Although an integral assembly typically includes glass, it should be appreciated that an integral assembly may instead include substantially any suitable transparent material. In general, a suitable transparent material may include any synthetic transparent material, as for example, synthetic sapphire. As previously mentioned, an integral assembly may also include a transparent material such as plastic.

The formation of a bezel around a glass member substantially eliminates tolerance issues associated with the bezel and the glass member. Because the material (e.g., metal) used in the bezel is provided in liquid form around the glass member, there is effectively no tolerance that has to be maintained with respect to the bezel. The liquid flows around the edge of the glass member, and when solidified, effectively grabs and adheres to the glass member.

In lieu of insertion molding material around a glass insert to form an integral assembly, an integral assembly may instead be formed by effectively trapping a glass insert within a heated metal bezel such that when the metal bezel cools, the metal bezel "grabs" onto the glass insert. That is, a MIM process may be used to mold metal around a glass insert such that the metal forms onto the glass insert, and to bake or sinter the metal such that the metal shrinks and holds the glass insert to form an integral assembly. Put another way, utilizing thermal expansion/contraction, the metal bezel is essentially shrink wrapped about the glass member.

FIG. 1 is a process flow diagram which illustrates a method of creating an integral assembly that includes a metal member and a transparent member, e.g., glass, using an insertion molding process in accordance with an embodiment of the present invention. A process 101 of forming an integral assembly that includes metal and a transparent member begins at step 105 in which a transparent member is obtained and prepared. It should be appreciated that although a transparent member is typically glass, substantially any transparent member may be provided in the mold cavity in lieu of a glass member. In other words, the transparent member may be, but is not limited to being, glass.

Preparing a transparent member for an insertion molding process may include creating retaining features at the edges of the glass plate member. The retaining features provide areas where metal can be molded relative to the transparent member, thereby increasing the strength of the coupling between the two materials. By way of example, the retaining features may be glass protrusions and/or voids formed in the edges of the transparent member. The protrusions and voids may include undercuts to further aid in coupling by providing features that may be molded around. The retaining features may be widely varied. For instance, the retaining features may be macro or micro, and a variety of techniques may be used to create such macro or micro retaining features. The retaining features may be formed using techniques including, but not limited to including, etching, machining, microperfing, and the like. Examples of retaining features will be discussed below with reference to FIGS. 4A-D and FIGS. 5A-B. It should also be appreciated that retaining features may not be necessary in some situations, as the mold interface and/or the mold around may provide sufficient retention forces.

In step 109, the transparent member is provided to a mold cavity of an overall mold apparatus. The mold is typically configured for an insertion molding process. The transparent member may, for example, be positioned within the mold cavity when the mold is opened such that the transparent member may be accommodated therein. The transparent member may be positioned or otherwise located at its desired position relative to the mold cavity and, thus, relative to the intended location of a metal member, which will couple thereto. The positioning of the transparent member within the mold cavity may be accomplished, for example, with a robot arm. It should be appreciated that providing the transparent member in the mold cavity may include performing additional steps such as preparing the mold cavity and transparent member for subsequent steps by adjusting a temperature within the mold cavity and closing the mold. In one example, if the thermal properties of the transparent material and metal to be insert molded do not substantially match, then providing the transparent member to the mold cavity may include heating the transparent member to a desired temperature. The mold cavity may have a shape that forms the desired or near net shape of the metal member. However, it should be appreciated that post processing steps may be used to clean up and/or substantially change the final shape of the metal member (e.g., machining, polishing, sandblasting, etc.). Generally, the mold cavity is larger than the transparent member at the region where the two members interface (as for example around the edges of the transparent member).

From step 109, process flow moves to step 113 in which liquid metal, or metal in a liquid form, is provided to the mold cavity. Although liquid metal is described, those of skill in the art will understand that substantially any liquid material which is capable of effectively bonding to the transparent material may be provided instead of liquid metal. The transparent member and the liquid metal are typically pre-selected to work together. For example, the transparent member and the liquid metal may be selected such that they have similar rates of thermal expansion. Additionally, the transparent material and liquid metal may be selected such that the temperature at which the transparent material softens is not significantly lower than the temperature at which the liquid metal maintains a liquid state. The transparent material and the liquid metal may be selected such that the temperature to which the transparent material and the liquid metal are heated, as for example to enable the liquid metal to maintain a liquid state, is not sufficient to cause significant softening of the transparent material. In one embodiment, the transparent material may have a softening point that is higher than the softening point of tempered glass. In some cases, the transparent material may be treated to help with this process.

After the liquid metal is provided to the mold cavity, a metal on transparent member molding technique is performed in step 117 in order to form a single, integral part. One metal on transparent member molding technique will be described below with reference to FIG. 2. When the transparent member is glass, the single, integral assembly may be a single, unified metal/glass part. For example, the glass is inserted into the mold, and then the liquid metal is injected into the mold and allowed to harden around the glass. Typically, molten metal in liquid form is flowed into the mold, allowed to surround the transparent member as appropriate, and cooled. Once solidified, the single, integral assembly that includes metal and transparent components may be ejected from the mold in step 121. That is, once the metal cools and hardens substantially around the transparent member, the mold may be opened, and ejectors may release the integral assembly from the mold. It should be appreciated that the liquid metal may be molded to all or some portion of the transparent member. It may be molded to a front surface, back surface, and/or side surfaces depending on the needs of the final integral assembly. In one example, the liquid metal is molded to the side of a substantially planar glass member (e.g., to an edge portion). In this example, the liquid metal may substantially only contact the edge portion and/or it may partially wrap around one or both planar surfaces of the transparent member (e.g., front surface and/or back surface).

Finishing steps are performed on the single, integral assembly or molded part in step 125. By way of example, finishing steps may include, but are not limited to including, sandblasting the integral assembly or some portion thereof, grinding the integral assembly or some portion thereof, machining the integral assembly or some portion thereof, polishing the integral assembly or some portion thereof, adding coatings to the integral assembly or some portion thereof, and the like. In general, finishing steps may be performed with respect to the integral assembly such that finishing steps are performed individually on the metal member and on the transparent member, or such that finishing steps may be performed on both the metal member and the transparent member.

Once finishing steps are performed on the integral assembly, the integral assembly is assembled into an electronic device in step 129. In one example, the metal member is a housing component of the electronic device, while the transparent member is arranged to form a window or a screen of the electronic device. The process of forming an integral assembly is essentially completed once the integral assembly is assembled into an electronic device. The metal member may form all or some portion of the entire housing of the electronic device (e.g., all or some portion of a bezel). The metal member may include retention features for attachment to other portions of a housing of the electronic device. These retention features may include, but are not limited to including, snap features, fasteners, or the like. The retention features may be molded during step 113, or they may be formed in post processing steps, as for example through machining the metal member or welding or otherwise attaching the features to the metal member.

In one embodiment, a transparent member is a glass plate, and the mold cavity forms the shape of a housing component of an electronic device. The mold cavity may instead form the shape of a bezel that effectively holds a glass plate is arranged to be incorporated into a housing of an electronic device. An electronic device into which an integral assembly that includes a transparent member and a metal member may include, but is not limited to including, substantially any electronic device that includes a glass window as for example computers, laptops, and handheld computing devices such as media players, phones, remote controls, and the like. In one example, the bezel surrounds the entire edge of the glass plate. It should be appreciated, however, that this is not a limitation and that the bezel may only cover a portion of the edge in either a continuous manner or a discrete points or lengths about the edge depending on the needs of the device. It should also be appreciated that the edge is not a limitation and that the bezel may cover other areas of the glass plate including, for example, the front and back surfaces.

Figure 2:
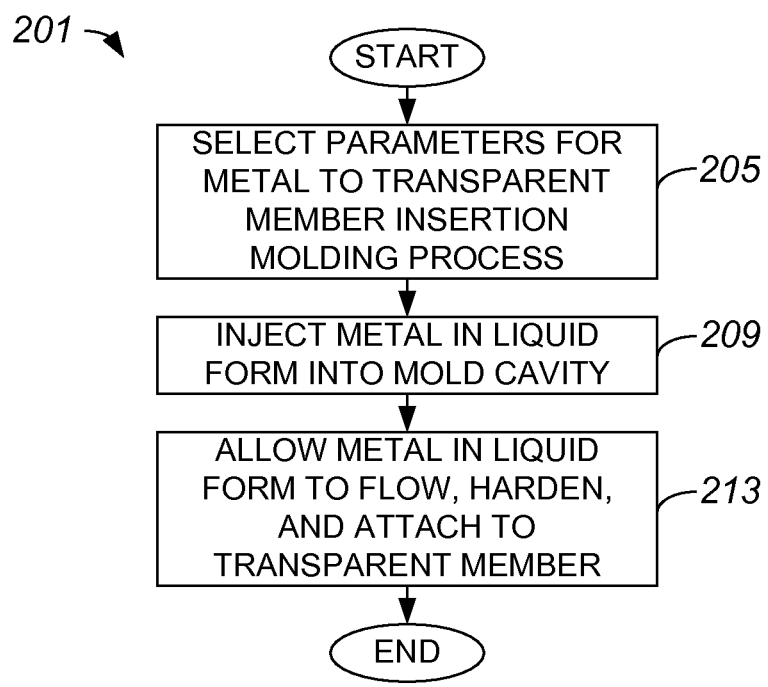
FIG. 2 is a process flow diagram which illustrates one method of forming metal to a transparent member such as a glass plate in accordance with an embodiment of the present invention.

FIG. 2 is a process flow diagram which illustrates one method of forming metal to a transparent member such as a glass plate in accordance with an embodiment of the present invention. A process 201 of forming a metal on transparent member assembly begins at step 205 in which parameters for a metal to transparent member insertion molding process are selected. The parameters may include mold parameters, parameters associated with the transparent member and metal parameters associated with a molding process. The parameters may also include mold configuration parameters, glass properties, and metal properties. It should be appreciated that parameters associated with the properties of a transparent member and properties of a metal member often selected prior to the transparent member being positioned in a mold cavity.

In one embodiment, selecting parameters may include substantially matching a thermal expansion rate of the transparent member to a thermal expansion rate of the metal. In the event that the thermal expansion rates of the transparent member and the metal do not substantially match, selecting parameters may include determining whether the transparent member should be heated or cooled differently than the metal to effectively compensate for dissimilar thermal expansion rates. The selection of parameters may further include selecting temperatures associated with the insertion molding process. Selecting temperatures may include selecting an appropriate temperature at which the insertion molding process occurs such that the transparent member is not significantly softened, while the metal flows in a liquid form.

Once parameters are selected in step 205, process flow moves to step 209 in which metal in liquid form is injected into the mold cavity. The metal in liquid form may, for example, be a molten metal alloy. One suitable example for the metal in liquid form is LiquidMetal, although it should be appreciated that LiquidMetal is but one example of a metal in liquid form that may be suitable for use in an insertion molding process.

In step 213, the metal in liquid form is allowed to flow, harden and attach to the transparent member inside the mold cavity. For example, the metal in liquid form may flow within the mold cavity and come into contact with one or more edges of the transparent member. It should be appreciated that relatively complex metal shapes may be molded around the transparent member. By way of example, the metal in liquid form may be configured to substantially surround all the edges of the transparent member to thereby effectively trap or otherwise integrally engage the transparent member within the confines of a metal member formed from the metal in liquid form. Upon allowing the metal to attach to the transparent member, the process of forming a metal on transparent member assembly is completed.

Figure 3:
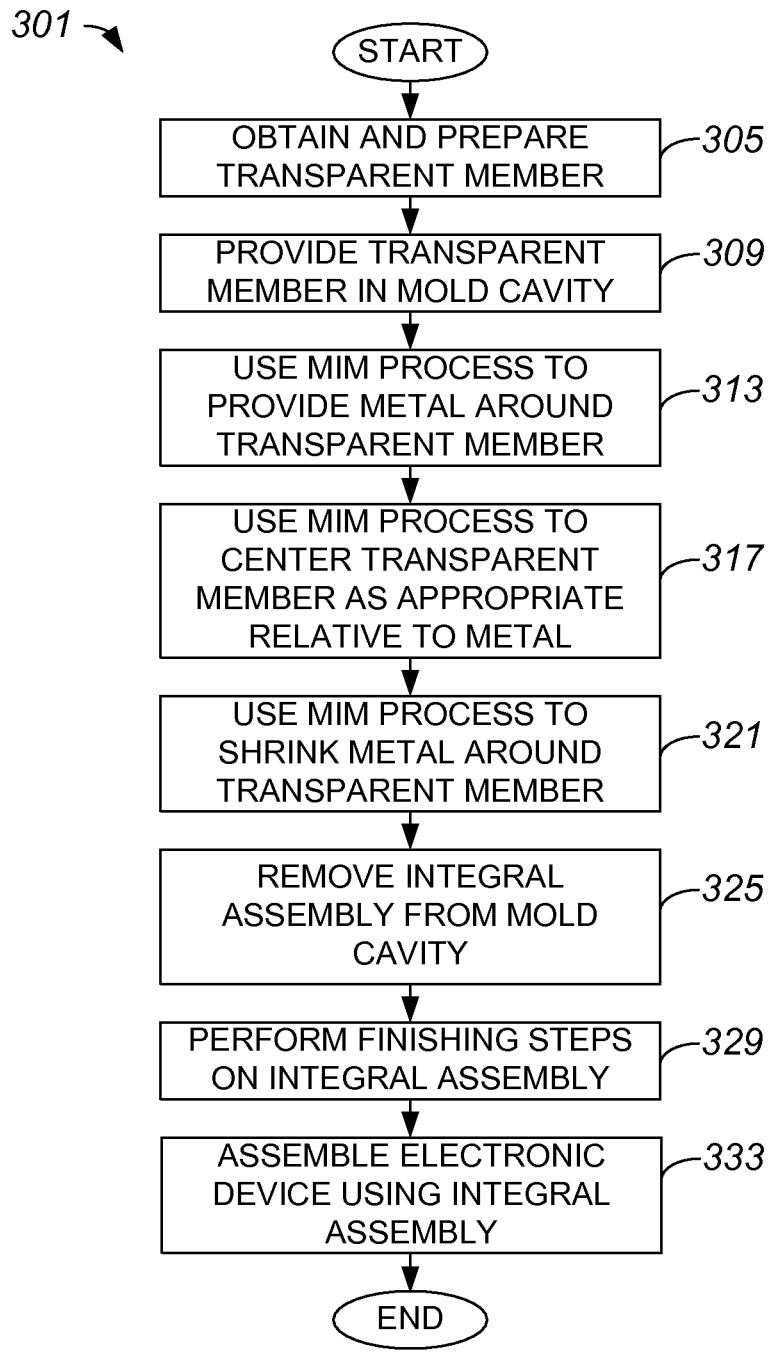
FIG. 3 is a process flow diagram which illustrates one method of creating an integral assembly that involves a metal injection molding (MIM) process in accordance with an embodiment of the present invention.

As previously mentioned, a MIM process may be used to form an integral assembly that includes a transparent member and a metal member. With reference to FIG. 3, a method of creating an integral assembly that involves a MIM process will be described in accordance with an embodiment of the present invention. A process 301 of forming an integral assembly that includes metal and a transparent member begins at step 305 in which a transparent member is obtained and prepared. Preparing a transparent member for a MIM process may include creating retaining features at the edges of the glass plate member.

The transparent member is provided to a mold cavity of an overall mold apparatus in step 305. Then, in step 313, a MIM process is used to provide metal substantially around the transparent member, as will be discussed below with reference to FIG. 7A. The metal may be provided as metal powder that is mixed with a binder. After the metal is provided, the MIM process is used to center the transparent member as appropriate relative to the metal in step 317. In one embodiment, centering may include positioning the transparent material such that when the metal adheres to the transparent material and subsequently shrinks, the metal forms a bezel or housing around the transparent material.

In one embodiment, centering may occur at a temperature of approximately two thousand degrees Fahrenheit, although the temperature may vary depending upon the materials which are actually used. Hence, the transparent material may be selected such that its softening point is not significantly lower than the temperature at which centering may occur. Additionally, the transparent material and the metal may be selected such that their coefficients of thermal expansion are relatively close. Selecting a transparent material with a coefficient of thermal expansion that is relatively close to the coefficient of thermal expansion of the metal typically reduces internal stresses associated with an integral assembly that is subsequently formed from the transparent material and the metal.

From step 317, process flow moves to step 321 in which the MIM process is used to shrink or bake the metal around the transparent material. In general, the metal may shrink between approximately twenty percent and approximately thirty percent. Once the metal shrinks, an integral assembly that includes a transparent member and a metal member is formed. The integral assembly may be ejected from the mold in step 325. Ejecting the integral assembly may include opening the mold, and ejecting the integral assembly from the mold.

Finishing steps are performed on the single, integral assembly or molded part in step 329. By way of example, finishing steps may include, but are not limited to including, machining the integral assembly, polishing the integral assembly, adding coatings to the integral assembly, and the like. After finishing steps are performed on the integral assembly, the integral assembly is assembled into an electronic device in step 333, and the process of forming an integral assembly is essentially completed.

Figure 4A:
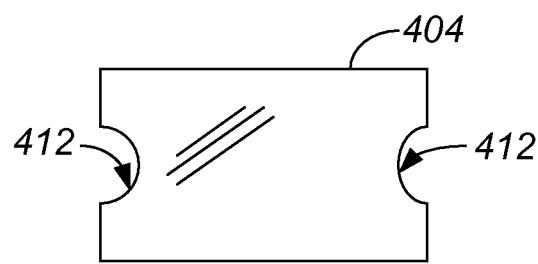
FIG. 4A is a diagrammatic cross-sectional side-view representation of a transparent member that may be included in an integral assembly in which channels have been formed in accordance with an embodiment of the present invention.
Figure 4B:
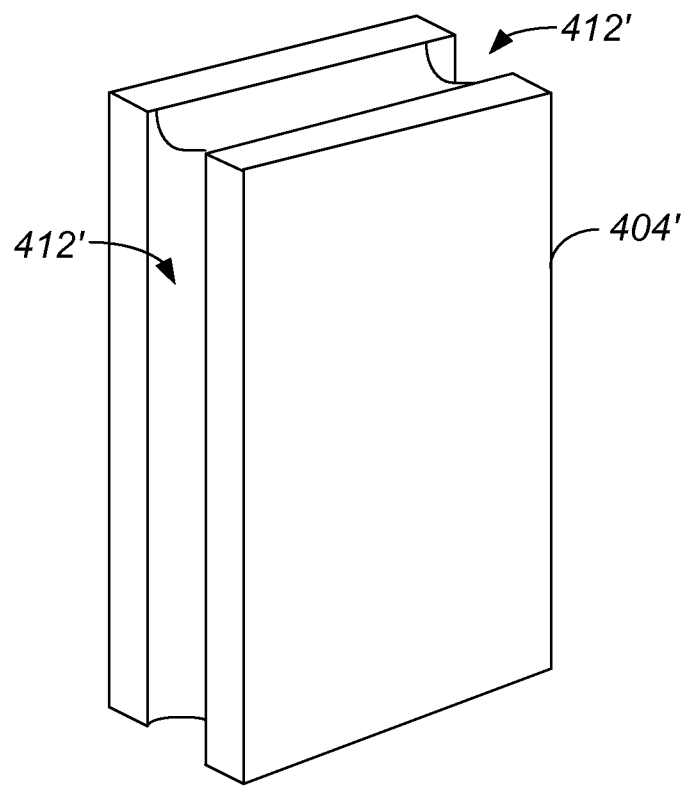
FIG. 4B is a diagrammatic perspective representation of a transparent member, e.g., transparent member 404 of FIG. 4A, in which channels of a first configuration have been formed in accordance with an embodiment of the present invention.
Figure 4C:
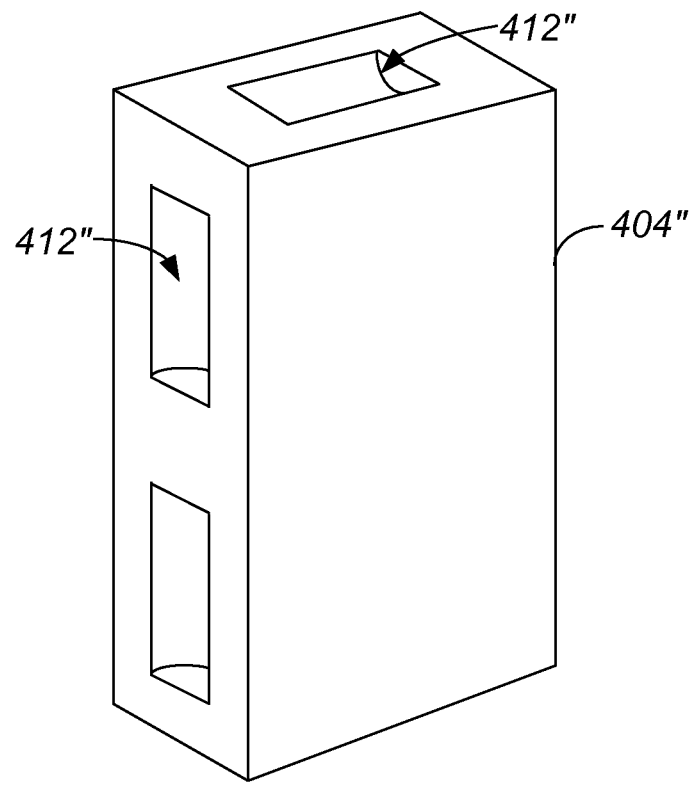
FIG. 4C is a diagrammatic perspective representation of a transparent member, e.g., transparent member 404 of FIG. 4A, in which channels of a second configuration have been formed in accordance with an embodiment of the present invention.

A transparent member, e.g., a glass member, that is a part of an integral assembly may include attachment features as mentioned above. For instance, the retaining features may be protrusions and/or voids formed in the edges of the transparent member. The protrusions and voids may include undercuts to further aid in coupling. FIG. 4A is a diagrammatic cross-sectional side-view representation of a transparent member which includes undercuts in accordance with an embodiment of the present invention. A transparent member 404 includes a at least one channel 412 on edges of transparent member 404 which are arranged or configured to come into contact with a metal member (not shown). Each channel 412 channel is dimensioned for receiving liquid metal. As shown in FIG. 4B, channels 412' may be continuous channels formed in transparent member 404'. Alternatively, as shown in FIG. 4C, channels 412" may be segmented on each edge of transparent member 404" that is configured to come into contact with metal. In another embodiment, a transparent member may include a plurality of discrete cavities such as dimples along each edge in contact with metal. The channels and cavities may be evenly spaced or placed asymmetrical locations relative to each other. The location of such channels and/or cavities generally depends on the desired needs of the interface between a transparent member and metal.

The channels and cavities can be formed in a variety of ways. In one example, channels and cavities are formed via machining or cutting operations. Alternatively, they may be formed with a cutting beam such as a laser or water jet stream. It should be noted that the invention is not limited to using cavities or channels to facilitate the bonding of a transparent member to a metal member. For example, the transparent member may include pegs or dovetails that are embedded in the edge of the transparent member. Alternatively, an intermediate member can be attached to the edge of the transparent member. For example, a metal to glass adhesion layer may be applied to the edge of a glass member. In one example, a material such as COVAR manufactured by Corning may be used. The channels may also be formed via chemical processes such as etching.

Figure 4D:
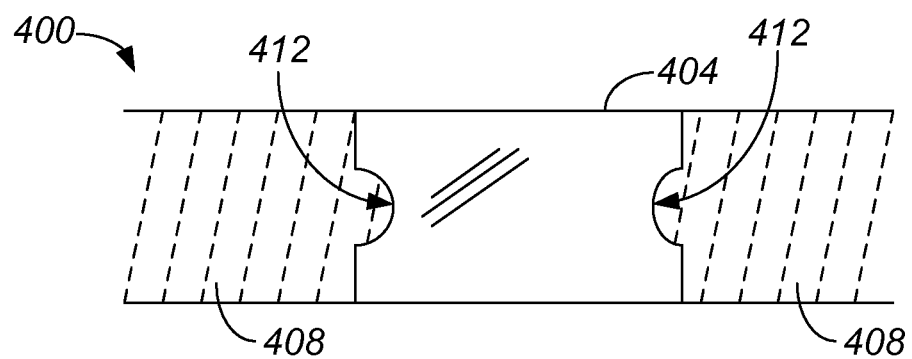
FIG. 4D is a diagrammatic cross-sectional side-view representation of an integral assembly which includes a transparent member, e.g., transparent member 404 of FIG. 4A, and a metal member in accordance with an embodiment of the present invention.

FIG. 4D shows an integral assembly that includes transparent member 404 of FIG. 4A and a metal member in accordance with an embodiment of the present invention. Integral assembly 400 includes a metal member 408 that is effectively molded into channels 412 of transparent member 404. Metal member 408 is bonded to edges of transparent member 404 and in channels 412. Channels 412 lock metal member 408 into place with respect to transparent member 404 in multiple directions, thereby significantly securing metal member 408 to transparent member 404. For an embodiment in which metal member 408 is shrink wrapped to transparent member 404, channels 412 may further provide a aligning effect, which helps center metal member 408 with respect to transparent member 404.

The shape of channels 412 may be widely varied. A channel 412 may be rectilinear, thereby having angled, chamfered and/or straight, perpendicular side walls. A channel 412 may also be curvilinear, thereby having curved contoured walls (as shown). In one embodiment, a channel 412 may have inwardly tapering walls that narrow relative to depth (whether rectilinear or curved), and may provide ease of flow during the molding processes. It should be appreciated, however, that outwardly tapering walls that spread out relative to depth (whether rectilinear or curved) may also be used. Such an implementation may provide better retention forces between metal member 408 and transparent member 404. It should also be noted that a combination of rectilinear and curvilinear channels 412 may be used. In addition, it should further be noted that channels 412 may be formed as various complex grooves such as reverse T shapes (small upper channel, larger lower channel), or vice versa. The exact configuration of channels 412 may depend on the characteristics and attributes of metal member 408 and transparent member 404. In the illustrated embodiment, channels 412 are substantially curves that taper inwardly from at least two opposing sides, while the other opposing sides of the channels are effectively straight walls.

Figure 5A:
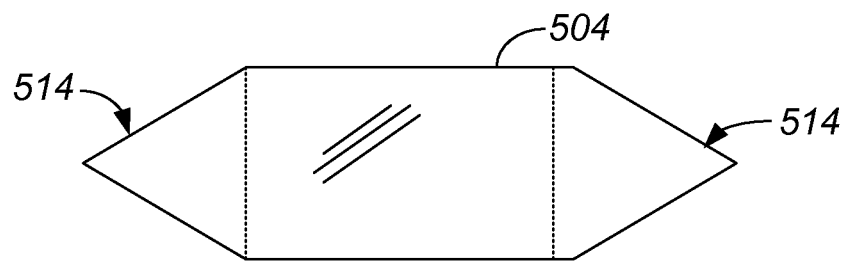
FIG. 5A is a diagrammatic cross-sectional side-view representation of a transparent member that may be included in an integral assembly in which bonding features have been formed in accordance with an embodiment of the present invention.
Figure 5B:
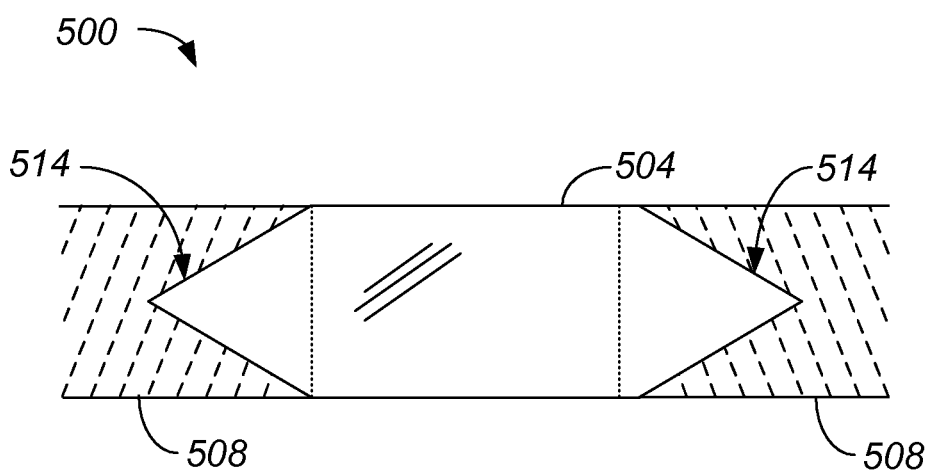
FIG. 5B is a diagrammatic cross-sectional side-view representation of an integral assembly which includes a transparent member, e.g., transparent member 504 of FIG. 5A, and a metal member in accordance with an embodiment of the present invention.

In another embodiment, the edge of a transparent member may include a protrusion that extends away from the edge and is arranged to be molded over. FIG. 5A is a diagrammatic cross-sectional side-view representation of a transparent member that may be included in an integral assembly in which bonding features such as a protrusion have been formed in accordance with an embodiment of the present invention. A transparent member 504 includes protrusion 514 that are arranged to be molded over. As shown in FIG. 5B, protrusion 514 may be molded over by a metal member 508 such that an integral assembly 500 is formed.

Like the channels described above, the shape of protrusion 514 may be widely varied. Protrusion 514 may be rectilinear having angled, chamfered and/or straight perpendicular side walls. Protrusion 514 may also be curvilinear having curved contoured walls (as shown). Inwardly tapering walls that narrow relative to depth (whether rectilinear or curved) may provide ease of flow during the molding processes. It should be appreciated, however, that outwardly tapering walls that spread out relative to depth (whether rectilinear or curved) may also be used (reverse trapezoid). Such an implementation may provide better retention forces between metal member 508 and transparent member 504. It should also be noted that a combination of rectilinear and curvilinear shapes may be used. Further, it should also be noted that protrusion 514 may be formed as various complex dovetails such as T shapes (small lower channel, larger upper channel) or vice versa. The exact configuration may depend on the characteristics and attributes of metal member 508 and transparent member 514.

In the illustrated embodiment, protrusions 514 are chamfers that taper inwardly from at least two opposing edges of transparent member 504. In the illustrated example, the tapered portions meet at a point. It should be appreciated, however, that the tapered portions may instead meet at a plateau region that is substantially flat.

It should be appreciated that retaining features are not limited to protrusions or channels, and may be a combination of the two embodiments. For example, a first set of opposing edges may include protrusions while a second set of opposing edges may include channels. In another example, each edge may include a combination of protrusions and channels. For example, an edge may include alternating discrete regions dedicated to channels and protrusions.

Figure 6A:
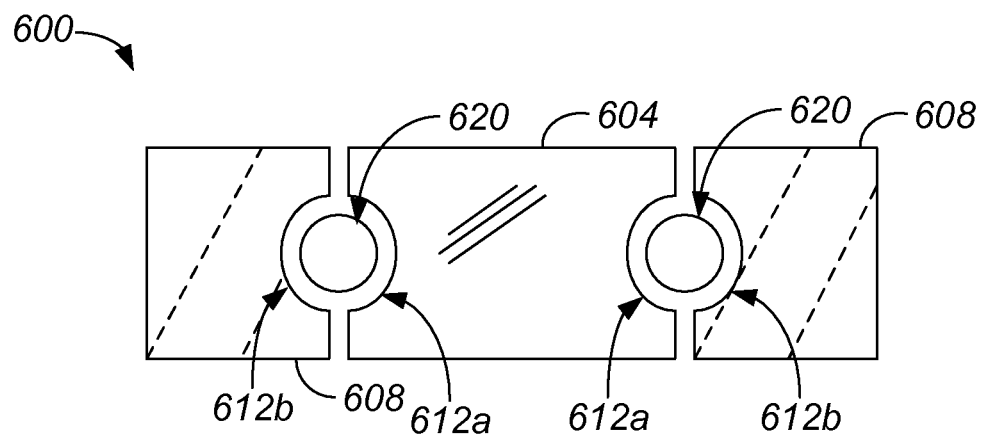
FIG. 6A is a diagrammatic cross-sectional side-view representation of an assembly in which a transparent member is inserted within an opening in a metal member in accordance with an embodiment of the present invention.
Figure 6B:
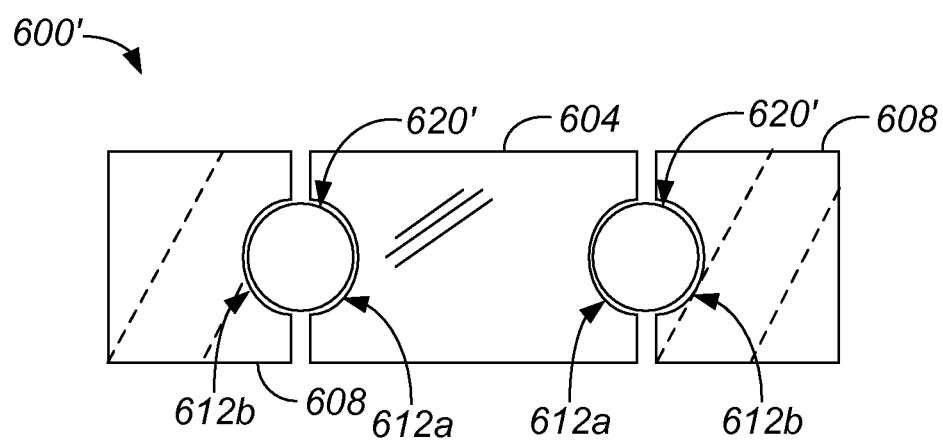
FIG. 6B is a diagrammatic cross-sectional side-view representation of an assembly, e.g., assembly 600 of FIG. 6A, in which a transparent member is effectively bonded to a metal member in accordance with an embodiment of the present invention.

FIGS. 6A and 6B show an alternate embodiment for positioning a glass plate member within an opening in a metal member in accordance with the present invention. In this embodiment, as shown in FIG. 6A, a gasket 620 is placed at the interface between the edge of a metal member 608 and a transparent member 604. In general, transparent member 604 is positioned within an opening in metal member 608. For example, the outer shape of transparent member 604 may generally coincide with the inner shape of metal member 608 (minus some small tolerance, which allows transparent member 604 to be fit therein). For example, metal 608 member may be in the form of a ring which may have a rectilinear shape, curvilinear shape or both, and transparent member 608 may be a platform that has an outer shape that is substantially the same as the open area of the ring. In this embodiment, metal member 608 includes a channel or cut-out 612b and transparent member 604 includes a channel or cut-out 612a that are arranged to accommodate gasket 620. Gasket 620 is configured to have two states. The first state for gasket 620 is shown in FIG. 6A, while the second state for gasket 620 is shown in FIG. 6B. The shape of gasket 620 in the second state may be configured to substantially conform to the shape of the cut-outs 612a, 612b.

In the first state, a cross section of gasket 620 is reduced or shrunk within cut-out portions 612a, 612b. In the second state, as shown in FIG. 6B, the cross section of gasket 620' is substantially expanded within cut-out portions 612a, 612b. Because of its expanded state, gasket 620' provides a biasing force between metal member 608 and transparent member 604 from opposing edges that helps trap or otherwise secure transparent member 604 within the opening in metal member 608. In essence, gasket 620 is an expandable continuous biscuits joiner. In one embodiment, gasket 620 changes form the first state to the second state based on a reaction parameter such as heat or chemicals. For example, heat may be applied to a cooled reduced gasket 620 in order for it to expand into expanded gasket 620'. Once in the expanded state, the expanded form of gasket 620' may be substantially permanent, or may be arranged to be transitioned back to a reduced state if another reaction is performed, e.g., if cold is applied. Gasket 620 may also be configured to react to other parameters such as electrical stimulus, magnetism and the like. In one example, a stimulus such as heat or electricity may be applied through metal member 608.

Gasket 620 may be formed from a flexible or rigid material. Additionally, it may be a soft or hard material or configuration. In one example, gasket 620 is formed from a shape memory material or shape changing material.

The gasket concept, or an embodiment which includes a gasket such as gasket 620, may be utilized with molding or MIM concepts. In fact, the heat supplied by these processes via a metal member may provide the state changing stimulus.

Figure 7A:
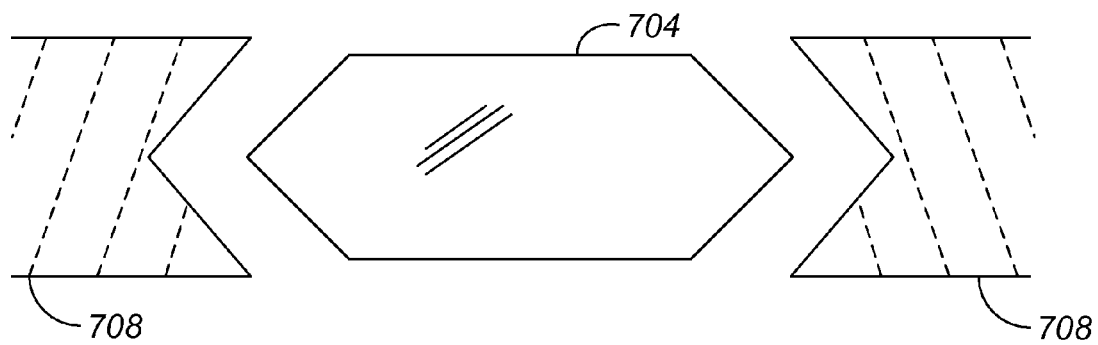
FIG. 7A is a diagrammatic cross-sectional side-view representation of a transparent member and a metal member prior to a baking or shrinkage step of a MIM process in accordance with an embodiment of the present invention.
Figure 7B:
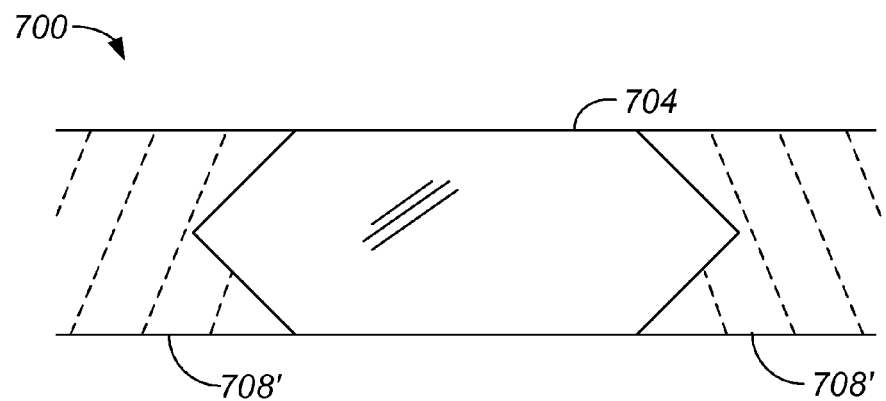
FIG. 7B is a diagrammatic cross-sectional side-view representation of a transparent member and a metal member, e.g., transparent member 704 and metal member 708 of FIG. 7A after a baking or shrinkage step of a MIM process in accordance with an embodiment of the present invention.

When a MIM process is used to form an integral assembly, a metal member may be sized such that when the metal member shrinks, the metal member engages a transparent member. FIG. 7A is a diagrammatic cross-sectional side-view representation of a transparent member and a metal member prior to a baking or shrinkage step of a MIM process in accordance with an embodiment of the present invention. A transparent member 704 is positioned with respect to a metal member 708 such that when metal member 708 shrinks, metal member 708 may engage transparent member 704. As shown in FIG. 7B, when metal member 708' shrinks or is baked, metal member 708' shrinks and engages transparent member 704 to form integral assembly 700.

The interface between the metal member 708' and transparent member 704 may be widely varied. Transparent member 704 and metal member 708' may include any combination of protrusions and channels to help lock the two members together. Such protrusions and channels may be similarly configured to any of those embodiments described above. For sake of brevity, these embodiments will not be described again. In the illustrated embodiment, however, transparent member 704 includes a protrusion and metal member 708' includes a channel that receives the protrusion when metal member 708' shrinks or wraps itself about transparent member 704. The shape of the protrusion may correspond to the shape of the channel. It should also be appreciated that the embodiment shown in FIGS. 6A and 6B may also be utilized in the embodiment of FIGS. 7A and 7B. In one example, a gasket does not provide two states, but rather relies on the two states of a metal member to trap and hold the gasket between the metal member and a transparent member.

In one embodiment, an interface may be formed between a transparent member and a metal member, e.g., a bezel, of an overall assembly. Such an interface may be arranged to prevent a transparent member from coming into contact with a metal member when the transparent member is effectively supported by the metal member, e.g., when a glass window is support by a bezel or housing in an overall assembly. An interface may also be arranged to serve as a shock absorbing layer in the vent that a device that includes an overall assembly is dropped.

Figure 8A:
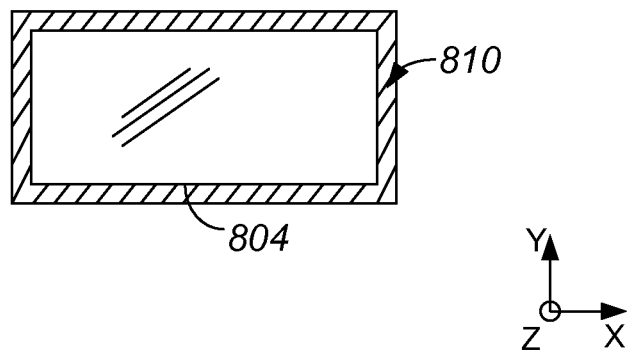
FIG. 8A is a diagrammatic top view representation of a transparent member on which a layer of compliant material has been formed in accordance with an embodiment of the present invention.

An interface between a transparent member and a metal member may be formed from any suitable compliant material. The compliant material may be applied to the edges of a transparent member and/or appropriate areas on a metal member. Compliant materials include, but are not limited to including, silicon, rubber, thermoplastic elastomers (TPEs), and poron. An interface may be a form, e.g., a form made from foam, that is placed around the edges of the transparent member. Referring next to FIG. 8A, a transparent member on which a layer of compliant material has been formed will be described in accordance with an embodiment of the present invention. A transparent member 804, which may be a glass window, includes at least one layer of compliant material 804 that is applied to the edges of member 804. The amount of compliant material that is applied, and the area of member 804 that is covered by compliant material 810, may vary widely. By way of example, compliant material 810 may be applied at specific areas along the edge of member 804. Complaint material 810 may include, but is not limited to including, rubber, silicon, plastic, springs, and the like.

Compliant material 810 may be printed onto edges of member 804, as for example using a Tampa printing technique. Depending upon the thickness desired for compliant material 810, multiple layers of compliant material 810 may be printed or otherwise applied to member 804. Once the desired thickness of compliant material 810 is achieved, member 804 may be inserted into an opening in a metal member, e.g., a bezel or a housing.

Figure 8B:
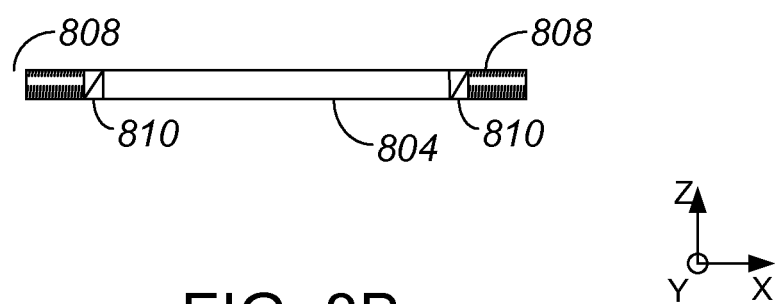
FIG. 8B is a diagrammatic cross-sectional side-view representation of an overall assembly that includes a transparent member and a metal member which are in substantial contact through a layer of compliant material in accordance with an embodiment of the present invention.
Figure 8C:
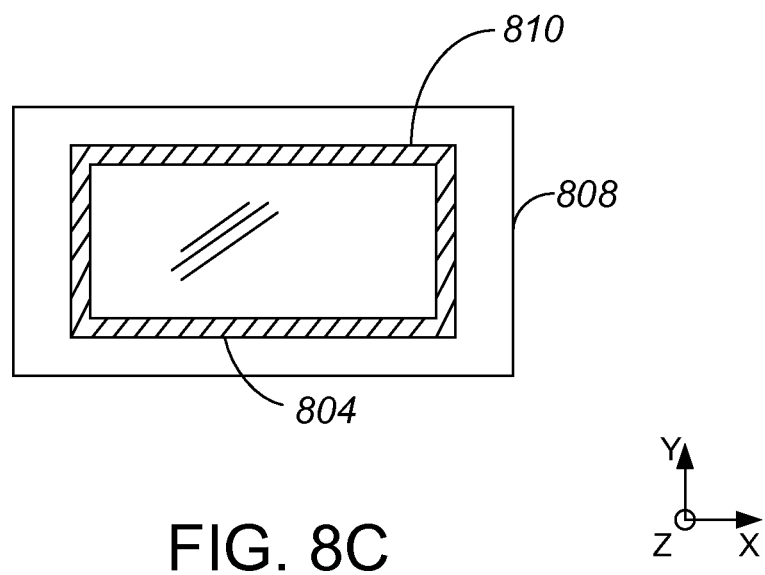
FIG. 8C is a diagrammatic top view representation of the overall assembly of FIG. 8B in accordance with an embodiment of the present invention.

FIG. 8B is a diagrammatic cross-sectional side-view representation of an overall assembly that includes transparent member 804 and a metal member in accordance with an embodiment of the present invention, and FIG. 8C is a diagrammatic top view representation of the overall assembly. A metal member 808 is arranged to adhere or otherwise bond to compliant material 810 such that transparent member 804 may effectively be held by metal member 808 without metal member 808 coming into substantially direct contact with transparent member 804. By way of example, compliant material 810 may substantially prevent glass to metal contact when transparent member 804 is a glass member.

It should be appreciated that in lieu of being applied to edges of a transparent member, a compliant material may instead be applied to areas along the top of a transparent material. Further, the transparent member may include chamfered edges that correspond to chamfered edge portions of an opening in a metal member.

Figure 9:
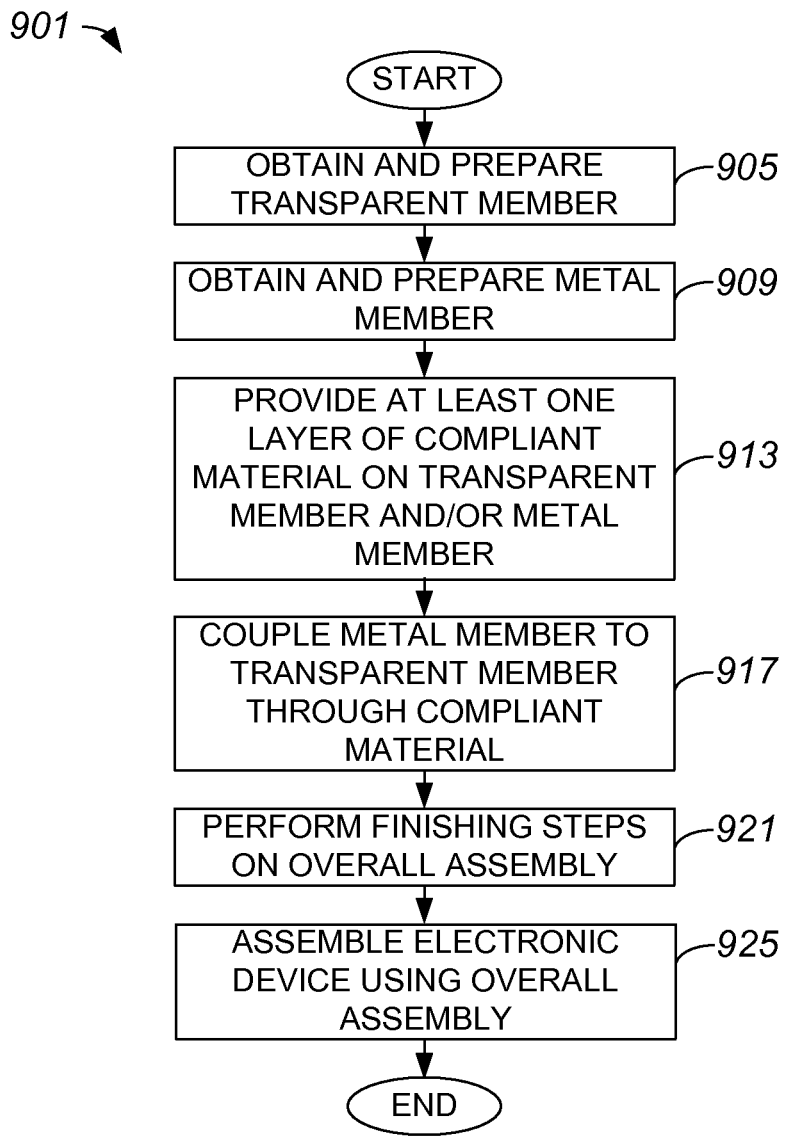
FIG. 9 is a process flow diagram which illustrates a method of forming an overall assembly that includes a transparent member and a metal member that are substantially separated by a layer of compliant material in accordance with an embodiment of the present invention.

FIG. 9 is a process flow diagram which illustrates a method of forming an overall assembly that includes a transparent member and a metal member that are substantially separated by a layer of compliant material in accordance with an embodiment of the present invention. A process 901 forming an overall assembly begins at step 905 in which a transparent member is obtained and prepared. In one embodiment, preparing the transparent member may include chamfering the edges of the transparent member. In step 909, a metal member is obtained and prepared. Although a metal member is described, it should be appreciated that a metal member is one example of a suitable member which may, together with a transparent member, form an overall assembly.

Once the transparent member and the metal member are obtained and prepared, at least one layer of a compliant material is provided on the transparent member and/or the metal member in step 913. In other words, compliant material may be applied to the transparent member, the metal member, or both. Any suitable method may be used to apply a compliant material including, but not limited to including, printing or screening the compliant material onto the surface of a transparent member and/or a metal member.

After the compliant material is applied, the metal member and the transparent member are coupled through the compliant material in step 917. The coupling may be facilitated through the use of an adhesive material, e.g., a liquid adhesive, and/or a press fit. Then, in step 921, finishing steps are performed on the overall assembly. Finally, an electronic device is assembled using the overall assembly in step 925, and the process of forming an overall assembly is completed.

Figure 10A:
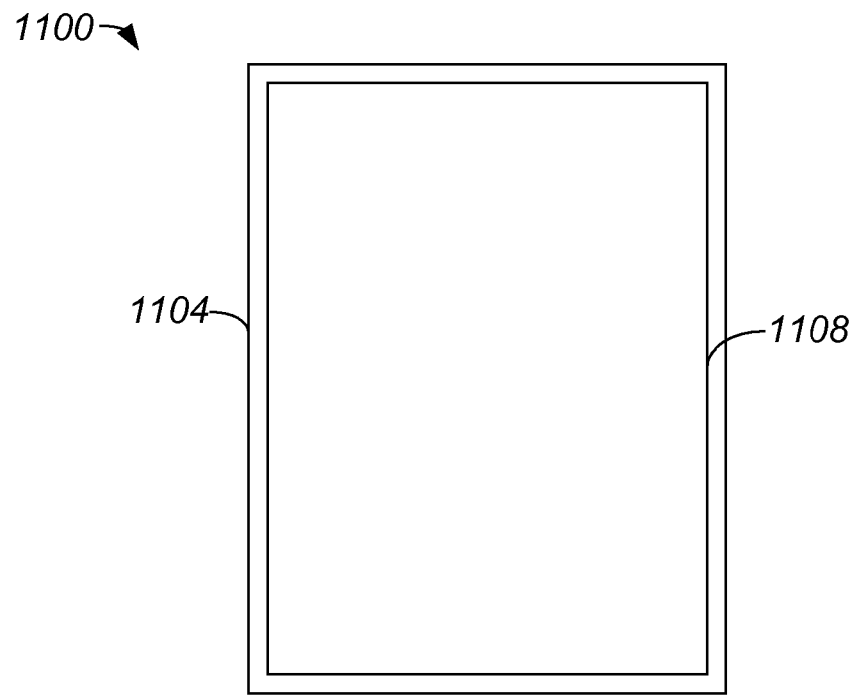
FIG. 10A is a diagrammatic representation of a first example of an electronic device that includes an assembly that includes a transparent member and a metal member in accordance with an embodiment of the present invention.
Figure 10B:
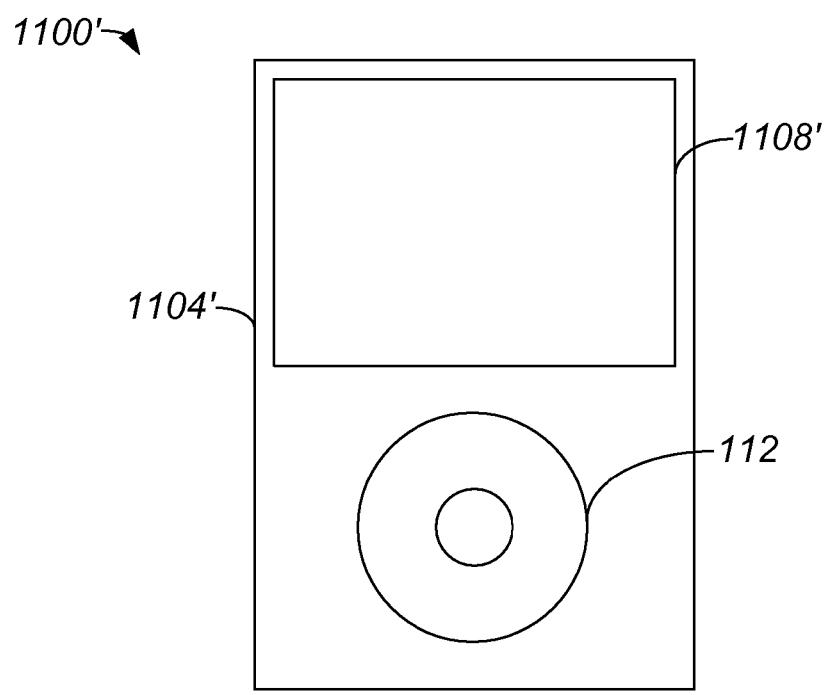
FIG. 10B is a diagrammatic representation of a second example of an electronic device that includes an assembly that includes a transparent member and a metal member in accordance with an embodiment of the present invention.
Figure 10C:
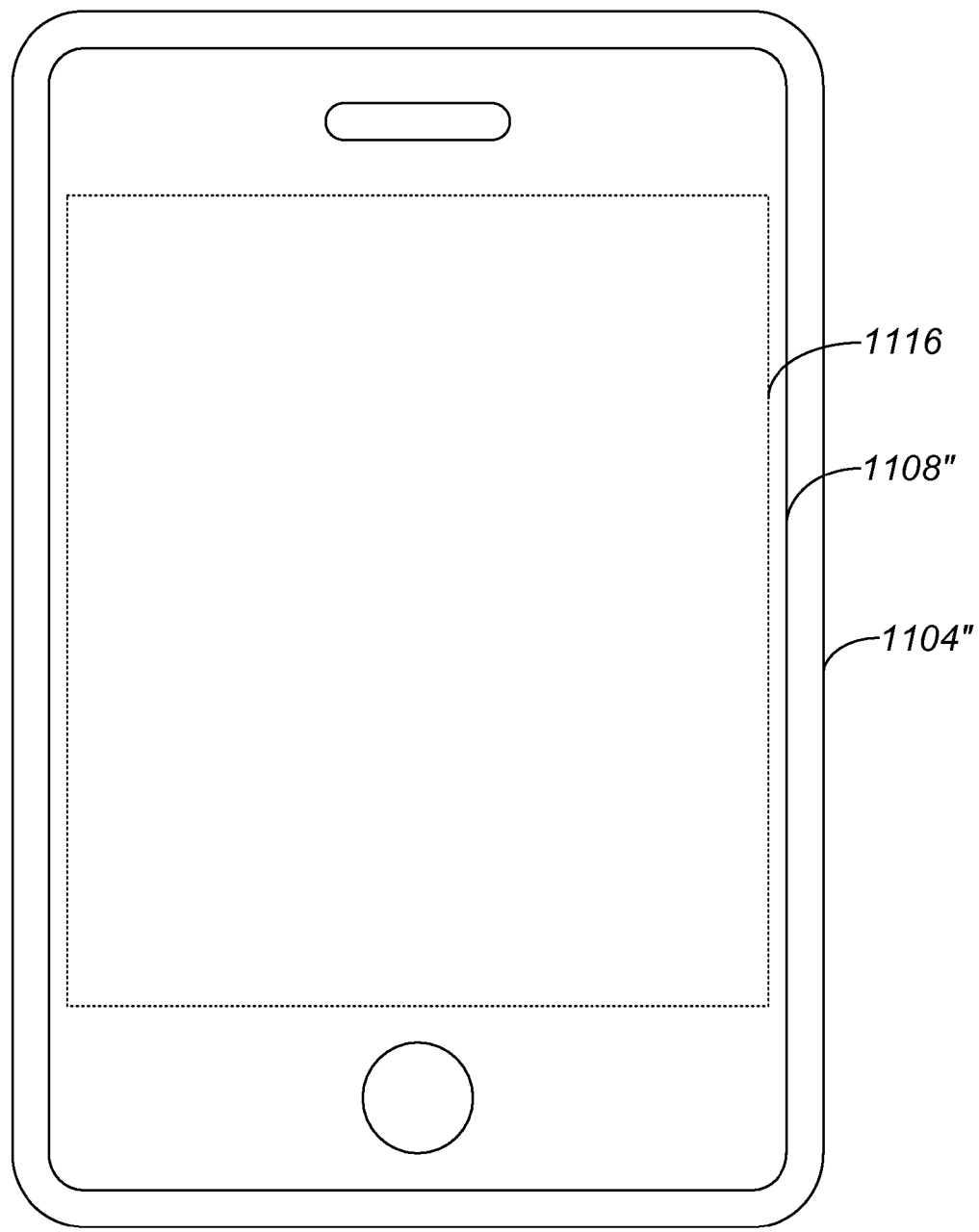
FIG. 10C is a diagrammatic representation of a third example of an electronic device that includes an assembly that includes a transparent member and a metal member in accordance with an embodiment of the present invention.

As previously discussed, integral assemblies may be assembled into electronic devices, e.g., handheld electronic devices. A handheld electronic device may, for example, be a media player, phone, internet browser, email unit or some combination of two or more of such. A handheld electronic device generally includes a housing and a display area. With reference to FIGS. 10A-C, electronic devices into which assemblies which include transparent members and metal members, e.g., an integral assembly formed using an insertion molding process, may be assembled will be described in accordance with an embodiment of the present invention. For ease of discussion, the transparent members will be described as glass plate windows, although it should be appreciated that transparent members may be formed from materials other than glass.

FIG. 10A is a diagrammatic representation of a first example of an electronic device that includes a glass/metal assembly in accordance with an embodiment of the present invention. An electronic device 1100, which may include internal electrical and/or communications components, includes a bezel or housing 1104 and a glass window 1108. In one embodiment, glass window 108 is integrally formed with bezel or housing 1104. Housing 1104 may include a bezel portion or, alternatively, housing 1104 may be a bezel.

Alternatively, glass window 1108 may be positioned within bezel or housing 1104 of electronic device 1100 such that a layers of a compliant material that are adhered to glass window 1108 and/or bezel or housing 1104 effectively serve as cushioning layers between bezel or housing 1104 and glass window 1108.

Glass window 1108 may generally be arranged or embodied in a variety of ways. By way of example, glass window 1108 may be configured as a protective glass piece that is positioned over an underlying display such as a flat panel display (LCD) or touch screen display (LCD and a touch layer). Alternatively, glass window 1108 may effectively be integrated with a display, i.e., glass window 108 may be formed as at least a portion of a display. Additionally, glass window 1108 may be substantially integrated with a touch sensing device such as a touch layer associated with a touch screen. In some cases, glass window 108 acts as the outer most layer of the display area.

FIG. 10B is a diagrammatic representation of a second example of an electronic device that with a glass/metal part in accordance with an embodiment of the present invention. An electronic device 1100' includes a bezel or housing 1104' and a glass window 1108'. In one embodiment, glass window 1108' and bezel or housing 1104' form an integral assembly, i.e., a glass/metal part, that is created by either an insertion molding process or a MIM process. Alternatively, glass window 1108' may be positioned within bezel or housing 1104' of electronic device 1100' such that a layers of a compliant material that are adhered to glass window 1108' and/or bezel or housing 1104' effectively serves as a cushioning layer between bezel or housing 1104" and glass window 1108". As a front surface of electronic device 1100' also includes a click wheel control 1112, glass window 1108' does not cover the entire front surface of electronic device 1100' Electronic device 11100' essentially includes a partial display area that covers a portion of the front surface.

FIG. 10C is a diagrammatic representation of a third example of an electronic device that includes a glass/metal part in accordance with an embodiment of the present invention. An electronic device 1100" includes a bezel or housing 1104" and a glass window 1108" that substantially fills the entire top surface of electronic device 1100". In one embodiment, glass window 1108" may be positioned within bezel or housing 1104" of electronic device 1100" such that a compliant material effectively serves as a "boundary layer" between bezel or housing 1104" and glass window 1108". In another embodiment, glass window 1108" and bezel or housing 1104" are an integral assembly formed from a process such as insertion molding or MIM. When glass window 1108" and bezel or housing 1104" are an integral assembly, a bond between glass window 1108" and bezel or housing 1104" are directly bonded with substantially no voids or gaps formed therebetween. Housing 1104" may include openings through which a speaker/receiver and/or buttons may be accessed. Housing 1104" may also include an opening or recess within which a display and/or touch screen 1116 is positioned.

Figure 11:
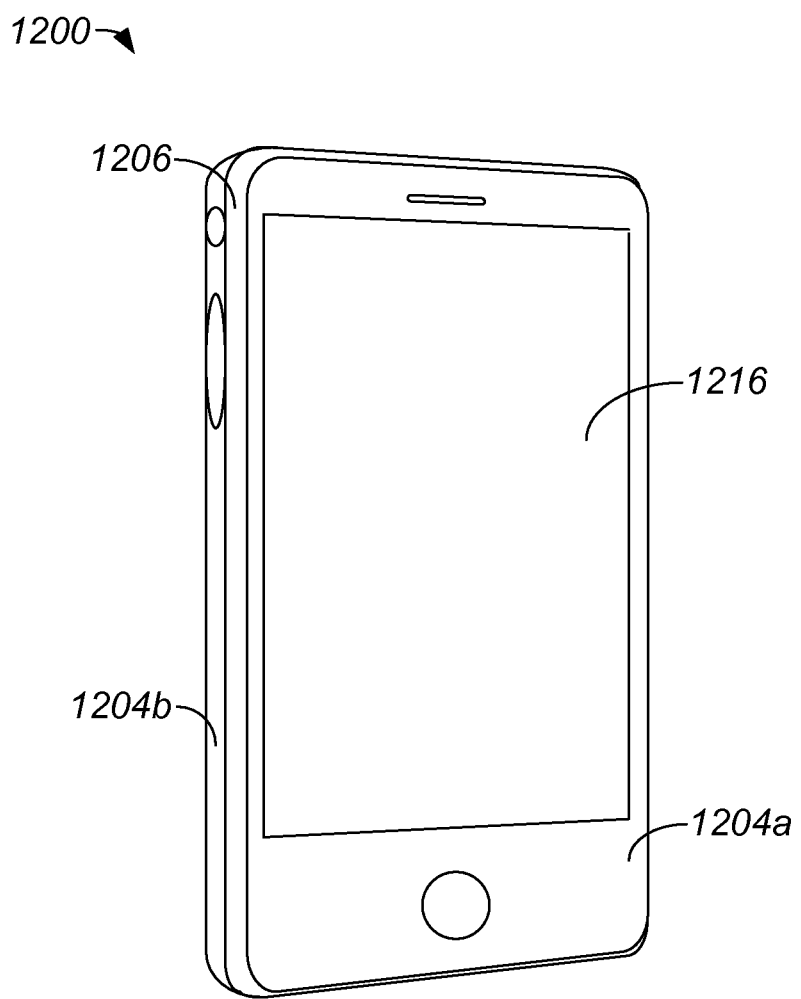
FIG. 11 is a diagrammatic perspective representation of an electronic device that includes a housing that includes an integrally formed glass and metal part in accordance with an embodiment of the present invention.

FIG. 11 is a diagrammatic perspective representation of an electronic device that includes an integrally formed glass and metal part, e.g., a glass and metal part in which the glass and metal components are substantially bonded with no gaps or voids therebetween, in accordance with an embodiment of the present invention. An electronic device 1200 includes a front housing 1204a and a back housing 1204b that are attached to form an enclosure of electronic device 1200. Front housing 1204b may, for example, include a bezel portion 1206 that surrounds a window 1216 that defines a display region of electronic device 1200.

Front housing 1204a and back housing 1204b may be formed from similar or dissimilar materials. Examples of materials used in front housing 1204a and back housing 1204b include, but are not limited to including, plastics, metals, ceramics, glass, and the like. In one embodiment, front housing 1204a is formed from at least a first material, and back housing 1204b is formed from at least a second material that is different than the first material. For example, front housing 1204a may be formed from a first metal such as steel, and back housing 1204b may be formed from a second metal such as aluminum. In addition, front housing 1204a may be formed from a metal (e.g., steel), and back housing 1204b may be formed either substantially entirely or partially with a plastic material (e.g., polycarbonate). Front housing 1204a and back housing 1204b work together to surround and protect the internal components of electronic device 1200. Front housing 1204a and back housing 1204b also form the ornamental shape of electronic device 1200 (e.g., help define the look and feel). Housing parts 1204a, 1204b may be attached in a variety of ways including, for example, using snaps, screws, adhesives and similar attachment means.

Although only a few embodiments of the present invention have been described, it should be understood that the present invention may be embodied in many other specific forms without departing from the spirit or the scope of the present invention. By way of example, the steps associated with the methods of the present invention may vary widely. Steps may be added, removed, altered, combined, and reordered without departing from the spirit of the scope of the present invention.

The techniques describe herein may be applied to a variety of electronic devices including but not limited handheld electronic devices, portable electronic devices and substantially stationary electronic devices. Examples of these include any known consumer electronic device that includes a display. By way of example, and not by way of limitation, the electronic device may correspond to media players, cellular phones, PDAs, remote controls, notebooks, tablet PCs, monitors, all in one computers and the like.

An interface between a metal member, e.g., a metal housing, and a transparent member, e.g., a glass window, may be formed using a variety of different methods. For instance, methods used to provide a material which may be used to effectively fill appropriate channels as discussed above with respect to FIGS. 6A and 6B may vary. In one embodiment, a material may be injected into such channels through local holes or openings formed in a metal housing. Such a material may be a plastic, glue, epoxy, silicon, or TPE, although it should be understood that substantially any suitable material may be used.

In general, an integral assembly may be used in substantially any electronic device which includes glass members. While mobile telephones such as the iPhone™ available commercially from Apple Inc. of Cupertino, Calif. and digital media players such as the iPod™ available commercially from Apple Inc. have been described, the electronic devices which utilize an integral assembly are not limited to those devices described. Therefore, the present examples are to be considered as illustrative and not restrictive, and the invention is not to be limited to the details given herein, but may be modified within the scope of the appended claims.

What is claimed is:

1. An apparatus comprising:
    an insert piece, the insert piece including a first channel;
    a metal member comprising an amorphous alloy, the metal member including a second channel; and
    a compliant material, the compliant material being arranged in the first channel and the second channel, wherein the compliant material couples the insert piece to the metal member.

2. The apparatus of claim 1 wherein the insert piece comprises glass, ceramic or plastic and the compliant member comprises a material selected from a group including a silicon, a rubber, a thermoplastic elastomer, poron, and any combination thereof.

3. The apparatus of claim 1, wherein the amorphous alloy maintains a liquid state at a temperature that is not sufficient to cause significant softening of the insert piece.

4. The apparatus of claim 1, wherein the insert piece is transparent.

5. An electronic device comprising:
    an assembly, the assembly comprising a metal member and an insert piece with substantially no voids disposed therebetween, the metal member and the insert piece cooperating to define an exterior portion of the electronic device; and
    at least one electronic element, the at least one electronic element being arranged to be at least partially covered by the assembly, wherein the metal member comprises an amorphous alloy; and wherein a thermal expansion rate of the metal member is approximately equal to a thermal expansion rate of the insert piece.

6. The electronic device of claim 5 wherein the insert piece comprises glass, ceramic or plastic.

7. The electronic device of claim 6 wherein the metal member comprises a bezel.

8. The electronic device of claim 5 wherein the electronic device comprises a cellular phone device.

9. The electronic device of claim 5, wherein the metal member forms all or some portion of an entire housing of the electronic device.

10. The electronic device of claim 5, wherein the electronic device comprises an electrical and/or communication component.

11. The electronic device of claim 5, wherein the amorphous alloy maintains a liquid state at a temperature that is not sufficient to cause significant softening of the insert piece.

12. The electronic device of claim 5, further comprising at least one layer of a compliant material at an edge of the insert piece.

13. The electronic device of claim 12 wherein the insert piece includes a first channel and the metal member includes a second channel, and a gasket is positioned at least partially in the first channel and at least partially in the second channel.

14. The electronic device of claim 5, wherein the electronic device comprises a computer, a laptop, a handheld computing device, a media player, a phone, a remote control, or any combination thereof.

15. The electronic device of claim 5, wherein the insert piece is transparent.

16. An integral assembly comprising: an insert piece and a metal member; wherein the metal member comprises an amorphous alloy and binds to the insert piece to create the integral assembly; and wherein a thermal expansion rate of the metal member is approximately equal to a thermal expansion rate of the insert piece.

17. The integral assembly of claim 16, wherein the insert piece is transparent.

18. An apparatus for forming an integral assembly comprising an insert piece and a metal member; wherein the metal member comprises an amorphous alloy, the apparatus comprising:
    an arm to position the insert piece in a mold; and
    a metal injector to provide the amorphous alloy around the insert piece in the mold to form the metal member such that the metal member binds to the insert piece to create the integral assembly.

19. The apparatus of claim 18 wherein the apparatus is configured to maintain the amorphous alloy in a liquid state at a temperature that is not sufficient to cause significant softening of the insert piece.

20. The apparatus of claim 18 wherein the apparatus is configured to center the insert piece relative to the metal member.

21. The apparatus of claim 18 wherein the apparatus comprises a metal injection molding (MIM) equipment.

22. The apparatus of claim 21, wherein the MIM equipment is configured to shrink or bake the amorphous alloy around the insert piece.

23. The apparatus of claim 18, wherein the insert piece is transparent.

* * * * *